United States Patent
Faley et al.

(10) Patent No.: US 6,353,234 B1
(45) Date of Patent: Mar. 5, 2002

(54) LAYERED ARRANGEMENT AND COMPONENT CONTAINING THE LATTER

(75) Inventors: Mikhail Faley, Jülich; Ulrich Poppe, Düren; Chunlin Jia, Jülich, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/242,366

(22) PCT Filed: Aug. 22, 1997

(86) PCT No.: PCT/DE97/01812

§ 371 Date: Feb. 11, 1999

§ 102(e) Date: Feb. 11, 1999

(87) PCT Pub. No.: WO98/08260

PCT Pub. Date: Feb. 26, 1998

(30) Foreign Application Priority Data

Aug. 23, 1996 (DE) .......................................... 196 34 118

(51) Int. Cl.[7] .............................................. H01L 29/06
(52) U.S. Cl. .............................. 257/31; 257/32; 257/33; 505/190
(58) Field of Search .............................. 257/31, 32, 33, 257/34, 35; 505/190

(56) References Cited

U.S. PATENT DOCUMENTS

| | | | |
|---|---|---|---|
| 4,177,476 A | * 12/1979 | Kroger et al. ................. | 357/5 |
| 5,057,491 A | * 10/1991 | Housley ......................... | 505/1 |
| 5,087,605 A | * 2/1992 | Hedge et al. ................... | 505/1 |
| 5,338,943 A | * 8/1994 | Wilber et al. ................. | 505/193 |
| 5,356,870 A | * 10/1994 | Fujiwara et al. ............. | 505/329 |
| 5,465,049 A | * 11/1995 | Matsuura et al. ........... | 324/248 |
| 5,508,255 A | 4/1996 | Eddy | |
| 5,547,922 A | * 8/1996 | Ma ............................. | 505/325 |
| 5,552,373 A | * 9/1996 | Agostinelli et al. ......... | 505/190 |
| 5,594,257 A | * 1/1997 | Nakamura et al. ............ | 257/39 |
| 5,696,392 A | * 12/1997 | Char et al. .................. | 257/190 |
| 5,773,843 A | * 6/1998 | Nakamura et al. ............ | 257/30 |
| 5,789,346 A | * 8/1998 | Nakamura et al. .......... | 505/329 |
| 5,817,531 A | * 10/1998 | Nakamura et al. ............. | 438/2 |
| 5,821,557 A | * 10/1998 | Nagamachi et al. .......... | 257/34 |
| 6,023,072 A | * 2/2000 | Silver .......................... | 257/33 |

FOREIGN PATENT DOCUMENTS

| | | |
|---|---|---|
| EP | 0 345 441 A2 | 12/1989 |
| EP | 0 430 798 A2 | 6/1991 |
| JP | 64-89571 * | 4/1989 |

\* cited by examiner

Primary Examiner—Sara Crane
(74) Attorney, Agent, or Firm—Herbert Dubno

(57) ABSTRACT

The invention concerns a layered arrangement comprising at least one layer based on a high-temperature superconductive material with at least one unit cell having a $CuO_2$ plane, the layer being connected to a non-supeconductive layer. A modified interface layer is provided between the two layers. Alternatively, at least one of the contacting layers can be modified in the interface region. Modification can be brought about by doping with metallic ions or implantation.

9 Claims, 3 Drawing Sheets

SCHEMATIC DESIGN OF AN EDGE CONTACT WITH A $PrBa_2Cu_3O_7$ BARRIER

SCHEMATIC DESIGN OF AN EDGE CONTACT WITH A $PrBa_2Cu_3O_7$ BARRIER

LAYERED ARRANGEMENT AND COMPONENT CONTAINING THE LATTER

CROSS REFERENCE TO RELATED APPLICATIONS

This application is a national stage of PCT/DE97/01812 filed Aug. 22, 1997 and based upon German national application 196 34 118.3 of Aug. 23, 1996 under the International Convention.

FIELD OF THE INVENTION

The invention relates to a layered arrangement in solid state systems. The invention also relates to a cryogenic component.

BACKGROUND OF THE INVENTION

The use of high temperature superconductors for incorporation in cryo-electronic components required the development of integrated multilayer circuits. Examples of superconductor integrated multilayer circuits are SNS-Josephson contacts or flux transformers. In addition, for producing a flux transformer for example, throughgoing contacts or strip conductor crossovers are frequently used.

Josephson contacts, through contacts and conductive strip crossovers are, in addition, the main components for a series of further multilayer components and are significant for cryo-electronics in general. The characteristics of such components in layered technology, for example, Josephson contacts, are a function of the barriers between the superconductive contacts through the barrier material and are not determined by the interfacial resistance of the boundary layer regions between the mutually-contacting layers.

For the desired suppression of interfacial resistances in such contacts, clean ex-situ fabricated boundary layers of high temperature superconductor materials like $YBa_2Cu_3O_{7-x}$ or $PrBa_2Cu_3O_{7-x}$ are prepared, for example, by chemical etching in nonaqueous Br-ethanol solutions {M. I. Faley, U. Poppe, H. Soltner, C. L. Jia, M. Siegel, and K. Urban, "Josephson Junctions, Interconnects and Crossovers on Chemically Etched Edges of $YBa_2Cu_3O_7$".—Appl. Phys. Lett., v. 63, No. 15, 2138–2140 (1993)}.

The chemical etching produces not only structurally undamaged boundary surfaces but also small edge angles of about 3°. The use of these shallow edges after structuring of the high temperature superconductor thin film is significant for two reasons. On the one hand, this edge structure supports current transport in the c-direction with strongly anisotropic high temperature conductors and provides a solution to the problems of current transport. On the other hand, such edge structures allow a relatively homogeneous covering of the base electrode by an insulating or nonsuperconductive layer.

The homogeneous covering or coating of the base electrode by a thin barrier layer is also of significance in the production of Josephson contacts. Ideally through-contacts (vias) should have the smallest possible interfacial resistance while, by comparison, good insulating characteristics are required for them in the production of conductive strip crossovers. Up to now, for insulation, cubic materials like for example $SrTiO_3$ or $CeO_2$ were often used. These materials have the drawback that the superconductive base electrode is frequently deficient in oxygen and may not have sufficient superconductive characteristics. Because of this drawback, the advantageous nonaqueous chemical etching in Br-ethanol for conductive strip crossovers or Josephson contacts cannot be used.

OBJECT OF THE INVENTION

It is therefore the object of the invention to provide a layered arrangement in which the quality of the boundary surface regions between the layers can be adjustable in a targeted manner in dependence upon the desired boundary conditions.

SUMMARY OF THE INVENTION

This object is achieved with a layered arrangement containing at least one layer on the basis of a high temperature superconductive material with at least one $C_uO_2$ plane forming unit cells. The layer is bonded to a nonsuperconducting layer. A modified interfacial layer is provided between the two layers. The object is further achieved with a cryogenic component having such a multilayer system.

According to the invention the high temperature superconductive material layer is bonded with a nonsuperconducting layer via a modified interfacial region at least on one of the mutually contacting layers. The surface region or the interfacial layer can be doped with ions, especially with metal ions for the modification. The surface region or the interfacial layer can be implanted with ions, especially with metal ions for the modification. The nonsuperconductive layer on its surface turned away the superconductive layer can also be modified in its surface region. Advantageously the nonsuperconductive layer on its surface turned away the superconductive layer is bonded to a further high temperature superconductive layer. $PrBa_2Cu_3O_{7-x}$ is a preferred material of the nonsuperconductive layer. A multilayer system with a plurality of layered arrangements as described above can form a through contact arrangement or a conductive strip crossover.

It has been found that in this way it is possible to produce an epitaxial multilayer system with high temperature superconductors for integrated cryo-electronic circuits which is especially suitable for producing Josephson contacts, through contacts or conductive strip crossovers. By contrast with earlier known comparable structures, it is possible to obtain in an advantageous manner improved superconductive characteristics within the overall heterostructure.

The layered arrangement according to the invention or the component according to the invention has a homogeneous epitaxial growth and a complete oxidation of the layer sequence, especially the multilayer structure. These requirements are fulfilled by the use of oxidic materials which are technically, chemically and structurally compatible with one another. It has been found that the oxidic high temperature superconductors basically have a charge carrier density which is comparable with that of highly doped semiconductors. The spatial variation in the charge carrier density, for example at boundary layers, can be, by comparison to customary metals, extend relatively large distances up to about 100 nm into the layer. As a result, the transport characteristics of thin oxidic materials can be strongly influenced by the behavior in the region of the interface between the respective layers.

With the aid of a modification of one or more of these boundary layers and thus of the adjustability of the value of the interfacial resistance over a wide range of values, it is possible to fabricate integrated multilayer systems based upon high temperature superconductors which fulfill the individual function-determining requirements of such cryo-electronic components.

A targeted variation or adjustability of the interfacial resistance can be produced by a targeted manipulation of the boundary layer in this manner. Thus different materials which are technologically, chemically and structurally compatible with one another can be used.

BRIEF DESCRIPTION OF THE DRAWING

The invention is described in greater detail in connection with Figures and an example explained below. In the drawing.

SPECIFIC DESCRIPTION AND EXAMPLE

Figure 1:
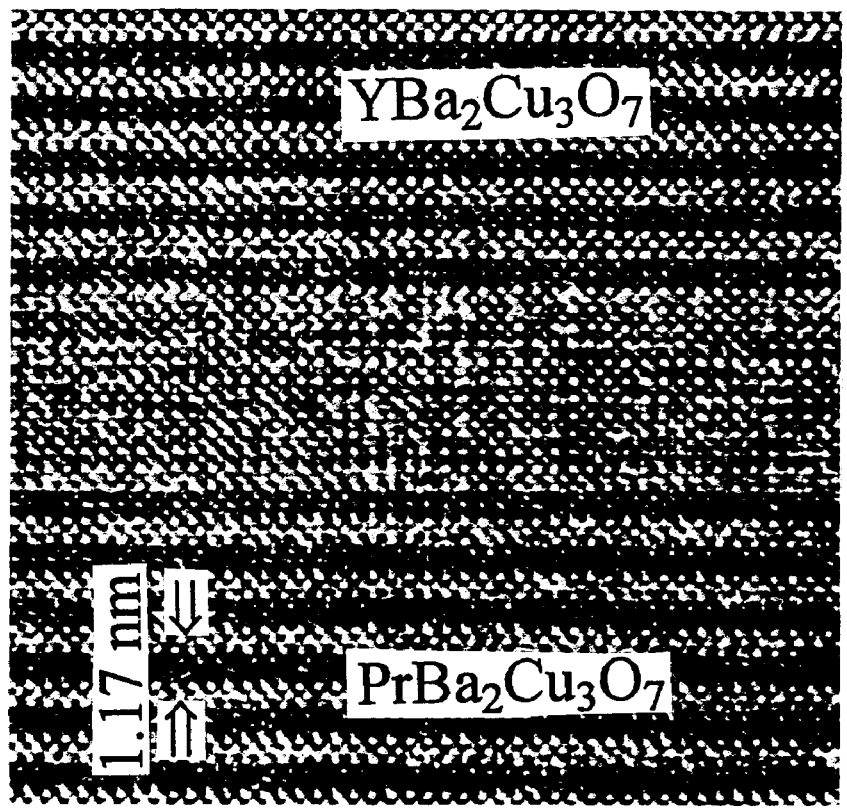
FIG. 1 is a high resolution transmission electron microscopic image of an intermediate layer at the boundary of a layered arrangement according to the invention and which is traceable to ion beam etching of the $PrBa_2Cu_3O_{7-x}$-layer.

FIG. 1 shows a TEM-picture of a layer sequence according to the invention. Visible therein is a modified intermediate layer at the interface between superconductive and nonsuperconductive layers of the layer arrangement according to the invention. This intermediate layer is obtained by an ion beam etching of the nonsuperconductive layer $PrBa_2Cu_3O_{7-x}$ before the formation of the superconductive layer applied to this layer.

In this manner a clean, undistorted boundary surface is obtained before modification of the nonsuperconductive-free layer surface by the use of a chemical etching in Br-ethanol in combination with photolithography by means of hard UV radiation in a known manner.

Structurally modified or damaged boundary surfaces are then produced by the action of the surface of oxidic material with an ion beam, especially with an energy of 600 eV. By varying the irradiation duration for the ion energy, desired boundary conditions of the modification and different degrees of damage at the boundary surfaces can be generated. In the case of epitaxial heterostructures of the high temperature superconductor $YBa_2Cu_3O_{7-x}$ thin films, for example by the combination of chemical etching with ion beam etching, interfacial resistances $R_nA$ in the range of $R_nA \approx 100$ $\Omega cm^2$ to less than $1 \times 10^{-10}$ $\Omega cm^2$ can be obtained. The value of A is the magnitude of the contact area.

Different and especially high values for the interfacial resistance can be generated alternatively or cumulatively by different modifications or manipulations of the boundary surfaces of the materials in a thin layer surface region, especially up to 10 nm, at the interface, especially by doping with different metal ions or by partial substitution of the oxygen, for example with F, Br, Cl.

An important recognition has been that with such interfacial modifications, a thin epitactic intermediate layer is obtained at the interface which can form an elevated interfacial resistance. The modified interface then influences the charge carrier density in electrode materials, especially the transport characteristic of $YBa_2Cu_3O_{7-x}$ in the region (up to 100 nm) of the boundary surfaces of the layer arrangement according to the invention here given as an example.

Figure 2:
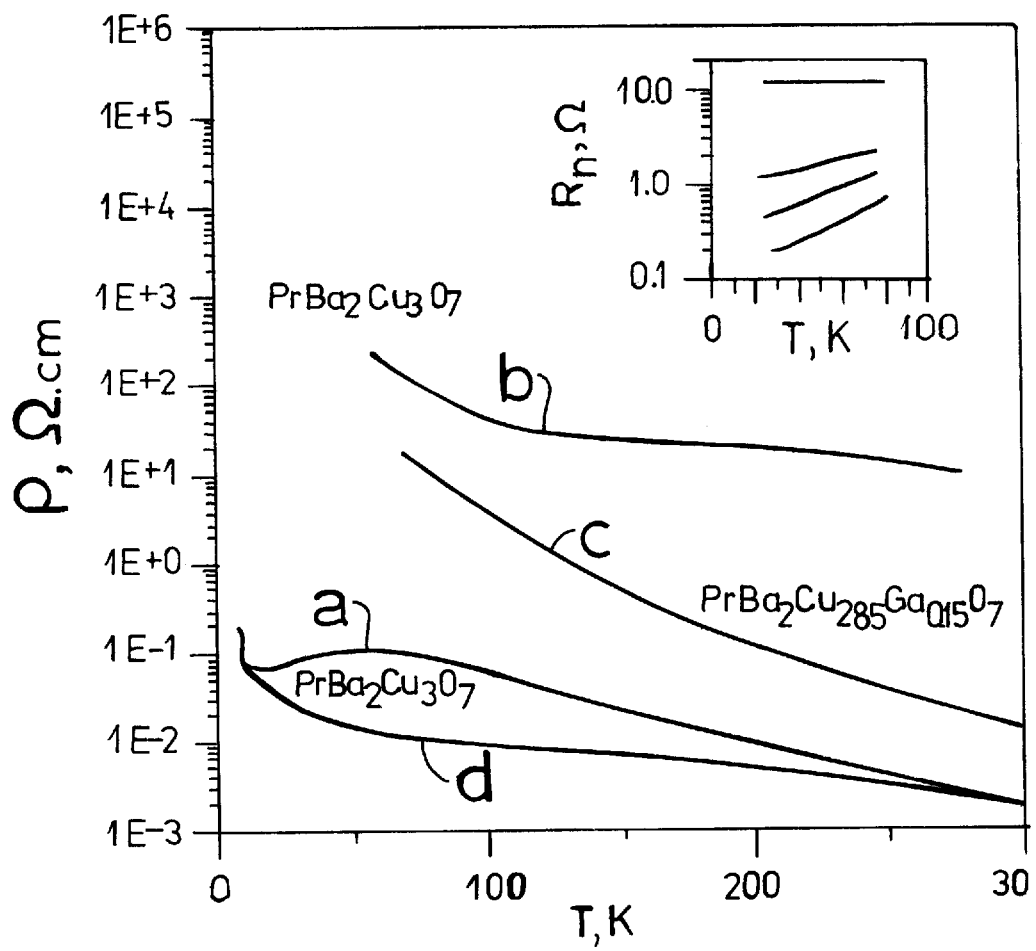
FIG. 2 plots specific resistance along the c-axis for a 0.5 μm thick $PrBa_2Cu_3O_{7-x}$-insulation layer arranged between two $Yba_2Cu_3O_{7-x}$- electrodes.

In FIG. 2, the specific resistance along the c-axis for 0.4 μm thick $PrBa_2Cu_3O_{7-x}$ "insulation" layers between two $YBa_2Cu_3O_{7-x}$ electrodes is given. The measured values are shown for the purely chemically-etched boundary surface by the curve "a" and at "b" for the ion beam etching dislocated boundary surface. The curves "c" and "d" indicate the specific resistance of $PrBa_2CU_{2.85}Ga_{0.15}O_{7-x}$ and $PrBa_2Cu_3O_{7-x}$ filaments ab copperoxide planes of these materials. The inset in the Figure mentioned shows the temperature dependency of the Josephson contact resistance $R_n(T)$ for contacts with barrier thicknesses of 10 nm, 20 nm, 30 nm and 100 nm (shown from bottom to top).

The modification of the interfacial resistance at the boundary surfaces between the $YBa_2Cu_3O_{7-x}$ layer and the $PrBa_2Cu_3O_{7-x}$ layer by argon ion etching enables the increase in the insulation resistance of the $PrBa_2Cu_3O_{7-x}$ insulation by up to four orders of magnitude (see FIG. 2). In this manner multilayer flux transformers of high quality can be produced.

A $PrBa_2Cu_3O_{7-x}$ layer between two $YBa_2Cu_3O_{7-x}$ electrodes with undamaged boundary surfaces shown, in a comparison to a massive probe, a very small specific resistance (inset in FIG. 2). This is advantageous for Josephson contacts because one can use in this manner relatively large barrier thicknesses (>10 nm) which is larger than typical surface roughnesses and as a result can produce a homogeneous current density distribution in Josephson contacts.

Figure 3:
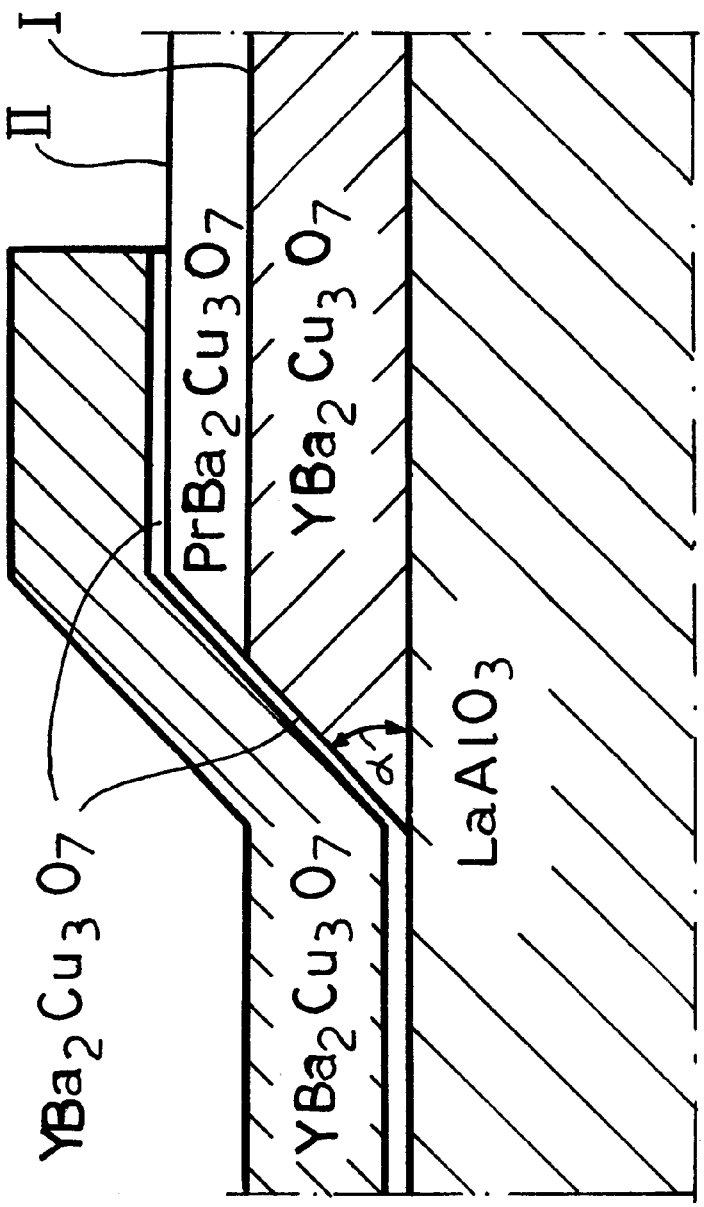
FIG. 3 is a side view of a Josephson contact according to the invention with modified boundary layer regions.
Figure 3:
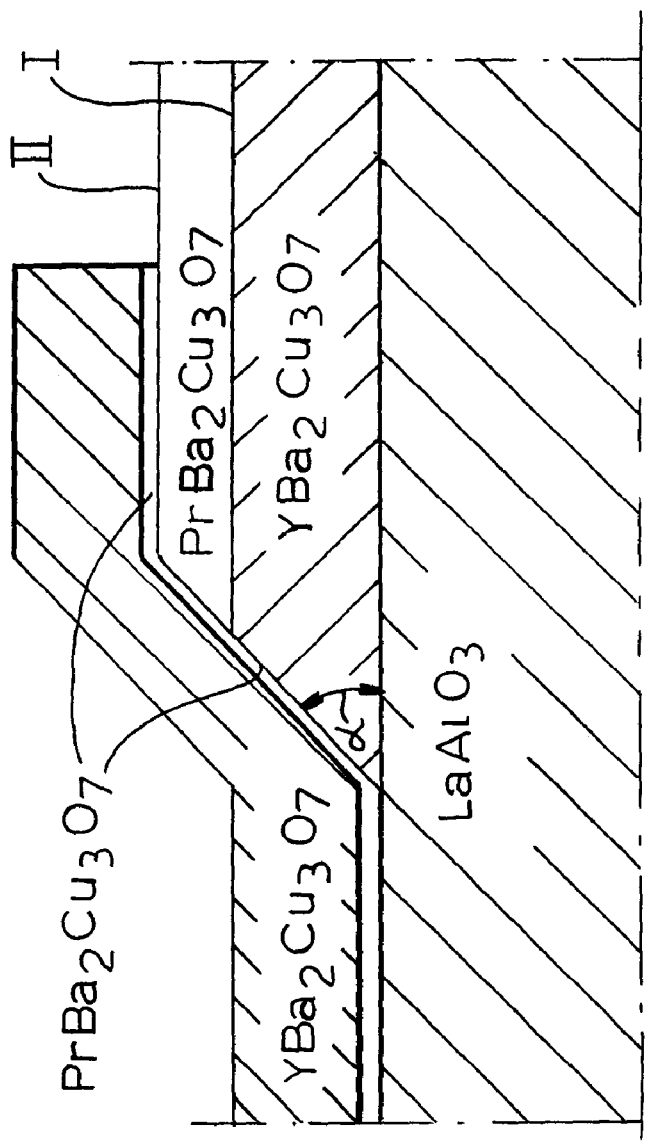

In FIG. 3 a Josephson contact according to the invention is shown in side view with a modified boundary layer region. A first superconductor electrode of $YBa_2Cu_3O_{7-x}$ is then formed on a substrate of $LaAlO_3$. A free interface I is then cleaned and modified to form a high surface resistance. On this is applied thereafter a nonsuperconductive layer of $PrBa_2Cu_3O_7$ whose upper surface II is also modified on the same ground.

Chemical etching is then carried out at an angle α of 3° to etch a slope therein and the free surface II of nonsuperconductor layer is covered with a thin (10–100 nm) layer of nonsuperconductive $PrBa_2Cu_3O_7$. Finally a further superconductive layer of $YBa_2Cu_3O_7$ is formed, preferably with a layer thickness in the range of 100 to 300 nm. On the slope in the region between both superconductor layers, a Josephson contact is then formed. The modification at the interfacial regions I and II provides a component with improved electronic characteristics since it has a better electrical insulation in the region of the components, where a current flow should be suppressed. The measured data according to the insert of FIG. 2 are given for such a contact.

A layer arrangement containing an epitaxial heterostructure contains at least one interface between an oxidic superconductor and a nonsuperconducting oxide (or an oxidic superconductor with a low critical temperature). With multiple building up of such a layer arrangement, a multilayer system can be obtained.

The superconductor oxidic material is characterized by a layer structure which contains at least oxygen and Cu and has a charge carrier density between $1 \times 10^{18}$ and $5 \times 10^{21}$ $cm^{-3}$. The nonsuperconductive oxidic layer is characterized by a compatibility with the superconductor layer in terms of technology, chemistry and structured and should preferably have a charge carrier density between $1 \times 10^{18}$ and $5 \times 10^{21}$ $cm^{-3}$.

The modification of the boundary layer in a thin (<10 nm) layer in the region of the boundary layer can be either structural or also chemical (e.g. doping) or of some other type. It can, for example, also be a very thin (<10 nm) intermediate layer of another material. The result is that a targeted manipulation of the interfacial damage influences the electron transport characteristics of the abutting materials.

It has been found to be advantageous in general to initially subject the layer surface to cleaning with the aid of known methods and then to carry out the modification by treating its surface or by applying a further modifying layer when the aforementioned procedure is not compulsory.

What is claimed is:

1. A superconductive device comprising at least one layer arrangement consisting of an epitactic first layer of a high temperature superconductor having at least one $CuO_2$ plane forming unit cells, an epitactic nonsuperconductive second layer composed of $PrBa_2Cu_3O_7$ and different from the material of said first layer, said first and second layers having thicknesses of more than 100 nm, and bonded to said first layer, and a boundary layer formed by ion-implantation of one of said first and second layers and chemically or physically or both chemically and physically modifying said one of said first and second layers and interposed between said first and said second layers for modifying charge density within said first and second layers up to 100 nm therein.

2. The superconductive device defined in claim 1 wherein said boundary layer is doped with metal ions.

3. The superconductive device defined in claim 1 wherein said one of said layers is said nonsuperconductive second layer.

4. The superconductive device defined in claim 1 wherein said nonsuperconductive second layer has a modified surface on a side thereof opposite that along which said boundary layer is provided and which has been subjected to ion implantation.

5. The superconductive device defined in claim 4 wherein said surface is bonded to a further high temperature superconductive layer.

6. The superconductive device defined in claim 1 wherein a plurality of said layer arrangements are provided in superimposition.

7. The superconductive device defined in claim 1 wherein said device forms a flux transformer.

8. The superconductive device defined in claim 1 wherein said device is a conductive strip crossover.

9. The superconductive device defined in claim 1 wherein said device forms a Josephson contact.

* * * * *

UNITED STATES PATENT AND TRADEMARK OFFICE
CERTIFICATE OF CORRECTION

PATENT NO. : 6,353,234 B1
DATED : March 5, 2002
INVENTOR(S) : Mikhail Faley et al.

It is certified that error appears in the above-identified patent and that said Letters Patent is hereby corrected as shown below:

Title page,
The Title page should be deleted and substitute therefore the attached Title page.

Drawings,
Delete Drawing sheet Fig. Sheet 3 and substitute therefore the drawing sheet consisting of Fig. 3.

Signed and Sealed this

Twenty-third Day of July, 2002

*Attest:*

*Attesting Officer*

JAMES E. ROGAN
*Director of the United States Patent and Trademark Office*

(12) United States Patent
Faley et al.

(10) Patent No.: US 6,353,234 B1
(45) Date of Patent: Mar. 5, 2002

(54) LAYERED ARRANGEMENT AND COMPONENT CONTAINING THE LATTER

(75) Inventors: Mikhail Faley, Jülich; Ulrich Poppe, Düren; Chunlin Jia, Jülich, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/242,366

(22) PCT Filed: Aug. 22, 1997

(86) PCT No.: PCT/DE97/01812

§ 371 Date: Feb. 11, 1999

§ 102(e) Date: Feb. 11, 1999

(87) PCT Pub. No.: WO98/08260

PCT Pub. Date: Feb. 26, 1998

(30) Foreign Application Priority Data

Aug. 23, 1996 (DE) .......................................... 196 34 118

(51) Int. Cl.[7] .............................................. H01L 29/06
(52) U.S. Cl. ........................... 257/31; 257/32; 257/33; 505/190
(58) Field of Search ............................ 257/31, 32, 33, 257/34, 35; 505/190

(56) References Cited

U.S. PATENT DOCUMENTS 4,177,476 A * 12/1979 Kroger et al. ................. 357/5
5,057,491 A * 10/1991 Housley ........................ 505/1
5,087,605 A * 2/1992 Hedge et al. .................. 505/1
5,338,943 A * 8/1994 Wilber et al. ................ 505/193
5,356,870 A * 10/1994 Fujiwara et al. ............. 505/329
5,465,049 A * 11/1995 Matsuura et al. ............ 324/248
5,508,255 A  4/1996 Eddy
5,547,922 A * 8/1996 Ma ............................. 505/325
5,552,373 A * 9/1996 Agostinelli et al. ......... 505/190
5,594,257 A * 1/1997 Nakamura et al. ........... 257/39
5,696,392 A * 12/1997 Char et al. ................... 257/190
5,773,843 A * 6/1998 Nakamura et al. ........... 257/30
5,789,346 A * 8/1998 Nakamura et al. .......... 505/329
5,817,531 A * 10/1998 Nakamura et al. ............ 438/2
5,821,557 A * 10/1998 Nagamachi et al. ......... 257/34
6,023,072 A * 2/2000 Silver ......................... 257/33

FOREIGN PATENT DOCUMENTS

EP  0 345 441 A2  12/1989
EP  0 430 798 A2  6/1991
JP  64-89571  * 4/1989

* cited by examiner

*Primary Examiner*—Sara Crane
(74) *Attorney, Agent, or Firm*—Herbert Dubno

(57) ABSTRACT

The invention concerns a layered arrangement comprising at least one layer based on a high-temperature superconductive material with at least one unit cell having a $CuO_2$ plane, the layer being connected to a non-superconductive layer. A modified interface layer is provided between the two layers. Alternatively, at least one of the contacting layers can be modified in the interface region. Modification can be brought about by doping with metallic ions or implantation.

9 Claims, 3 Drawing Sheets

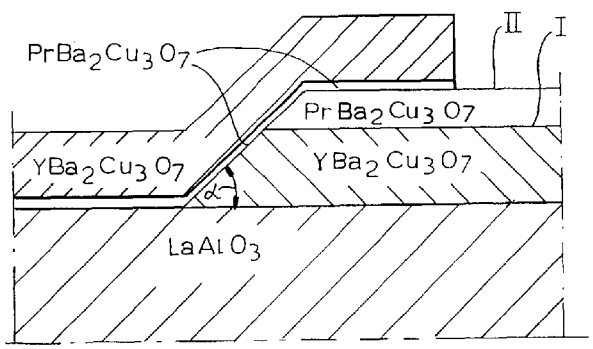

SCHEMATIC DESIGN OF AN EDGE CONTACT WITH A $PrBa_2Cu_3O_7$ BARRIER

SCHEMATIC DESIGN OF AN EDGE CONTACT WITH A $PrBa_2Cu_3O_7$ BARRIER